United States Patent Office 3,268,330 Patented August 23, 1966

3,268,330

METHOD FOR PRODUCING LEAD TELLURIDE THERMOELECTRIC ELEMENTS BY VACUUM HOT-PRESSING

Louis F. Kendall, Jr., Scotia, and James H. Bredt, Schenectady, N.Y., assignors to General Electric Company, a corporation of New York No Drawing. Filed June 26, 1964, Ser. No. 378,415
3 Claims. (Cl. 75—226)

Our invention relates to a method for producing thermoelectric elements having a high density of thermoelectric material therein, and in particular, to a hot pressing method for fabricating such elements.

Thermoelectric elements find application in the field of thermoelectric power generation, and especially in compact electrical apparatus of the type adapted to generate relatively small amounts of electric power as distinguished from power utility generating stations. Thermoelectric elements may take any of several forms and are fabricated from materials now generally known as thermoelectric material. Thermoelectric materials are distinguished from other materials due to a combination of thermal and electrical properties such that they exhibit a phenomenon known as the Seebeck effect to a greater degree than nonthermoelectric materials. This phenomenon occurs when two materials having dissimilar thermoelectric properties are joined at more than one junction and the junctions are maintained at different temperatures. As a result of the Seedbeck effect, a direct current will flow through the junctions, its direction depending upon the respective location of the relatively hot and cold junctions. The thermoelectric materials having dissimilar thermoelectric properties may be obtained by introducing small amounts of suitable impurities to a particular thermoelectric material, henceforth called doping, to obtain what is conveniently designated in semiconductor terminology as p-type and n-type thermoelectric material. The thermoelectric materials which presently find widest application in the thermoelectric generation of electric power are lead telluride, germanium telluride, bismuth telluride, tin telluride, elemental boron doped with carbon and an alloy of germanium and silicon. Other compounds also find utility in the thermoelectric power generation field.

Prior to applicants' invention, thermoelectric power generators were low performance devices, that is, operated at relatively low efficiency, generating a relatively small amount of electric energy per pound of system weight and failed to operate satisfactorily over an extended time period. One of the major reasons for the low performance of prior thermoelectric generators is the low density (approximately 85%) of the thermoelectric material employed in the thermoelectric elements. Specifically, the thermoelectric material conventionally utilized is dispersed with undesired holes probably originally formed by occluded gases. During operation of the thermoelectric generator, the thermoelectric material is stressed in the area of the hole sides and cracks tend to propagate within the material from hole to hole. The undesired holes probably develop during the process of shaping the thermoelectric material into desired thermoelectric element forms which has conventionally been done by cold pressing thereof. In the cold pressing process, thermoelectric material is pressed at ambient temperature within a containing device such as a graphite die and subsequently is sintered. The pressing and subsequent sintering is generally carried out in controlled gasesous atmospheres which gases may occlude within the thermoelectric material to form gas bubbles. The holes within the fabricated thermoelectric element may thus be bubbles of a particular gas or atmospheric air, the significant factor being that the holes decrease the density of the material and adversely affect its strength resulting in relatively poor performance thermoelectric generators constructed therefrom. Thus, it is highly desirable to provide a new method for fabricating thermoelectric elements wherein the density of the thermoelectric material is substantially 100% and thereby obtain improved performance of the thermoelectric generators constructed therefrom.

Therefore, one of the principal objects of our invention is to provide a new method for producing high density thermoelectric elements.

A further object of our invention is to fabricate such high density elements by a hot pressing method.

Briefly stated, the method for producing high density thermoelectric elements in accordance with our invention consists of depositing a specific amount of thermoelectric material within a containing device such as a die of a punch and die set and then evacuating a region including the thermoelectric material filled containing device to a substantial vacuum, preferably in the order of $10^{-6}$ torr to minimize any gaseous contamination of the thermoelectric material and containing device. The evacuation may be performed within a pressing chamber or in a separate chamber and subsequently transferred to the pressing chamber. Prior to the pressing thereof, the thermoelectric material is heated to a first temperature substantially below the melting point thereof, for example, to approximately 400° C., in the case of lead telluride. Upon attaining the first temperature, the thermoelectric material is pressed by exerting a predetermined pressure upon the containing device, that is, upon the punch in the case of a punch and die set for a predetermined time interval. Simultaneous with the exertion of pressure, the thermoelectric material is heated to a second temperature intermediate the first temperature and melting point of the thermoelectric material. The thermoelectric material, and containing device are maintained in a substantial vacuum environment during the aforementioned heating steps. The variables of pressure, temperature and time duration of maintaining both pressure and temperature are interrelated such that a greater magnitude of one or two of these variables permits a decrease in the level of the remaining two or one variables, respectively. The thermoelectric material is thence cooled to a third temperature substantially below the first temperature, and the pressed thermoelectric element having a density of approximately 99.5% is removed from the containing device.

It is preferable to take additional steps to ensure noncontamination of the thermoelectric material such as by initially heating the containing device in a vacuum and cooling in a relatively inert gaseous atmosphere. Further, the thermoelectric material may be weighed out and deposited within the containing device in an inert gaseous atmosphere.

The features of our invention which we desire to protect herein are pointed out with particularity in the appended claims. The invention itself, however, both as to its organization and method of operation, together with further objects and advantages thereof, may best be understood by reference to the following description.

The thermoelectric elements produced by our invention, as hereinafter described, may be composed of any of a number of known compositions having certain characteristics including a significant Seebeck effect, and thus may include lead telluride, bismuth telluride, a tin telluride alloy, an antimony telluride alloy, an alloy of magnesium, germanium, and tin, and other alloys or compounds. However, the method hereinafter described is not limited to producing thermoelectric elements from such compositions only, but may be applied to other materials generally described as thermoelectric materials.

Thermoelectric material may be further defined as being of the p-type or n-type, common designations in semiconductor terminology, to describe two compositions of the same predominant thermoelectric material but having different doping agents or impurities added thereto for obtaining dissimilar thermoelectric properties.

The thermoelectric material to be fabricated into thermoelectric elements in accordance with our invention may be of the type presently available for purchase in the commercial market. We prefer to use thermoelectric material, and in particular, lead telluride which may be synthesized by the following process. The n-type material is made by doping lead telluride with 0.03 mol percent lead iodide. The tellurium content of such material is about 37.95% by weight. The p-type lead telluride is doped with about 1.0 atom percent sodium and contains about 38.3% tellurium by weight. The ingredients employed are high purity elemental lead and tellurium, lead iodide, and sodium metal. The synthesizing process consists of carefully weighing out the ingredients, placing them in a fused quartz tube which has been previously vacuum baked, evacuating the tube to less than $10^{-5}$ torr, and then sealing off the tube. The quartz tube is next placed in a furnace and heated slowly to about 1000° C. The tube is then shaken several times while the sample is molten, the melting point being 917° C. After approximately one hour, the sample is cooled by quenching the sealed tube in water. The lead telluride thus synthesized has been found to possess the desired electrical and chemical characteristics commonly associated with thermoelectric materials, such as low thermal conductivity, low electrical resistivity and satisfactory Seebeck coefficient.

We fabricate the thermoelectric elements to be employed in thermoelectric generators by what may be described as a hot pressing method as distinguished from the cold pressing method conventionally employed and above-described. The cold pressing method includes the step of pressing the thermoelectric material without simultaneously heating the thermoelectric material.

Our hot pressing method will be described in detail with respect to the fabrication of lead telluride thermoelectric elements although it is to be understood that such method is applicable for other thermoelectric materials as well. The specific steps employed in our method are as follows: Lead telluride, preferably the type synthesized as hereinabove described, is first crushed to obtain coarse particles, thence ground to obtain a powder form of the lead telluride and finally sieved to obtain small particles thereof. The crushing, grinding and sieving is preferably accomplished in a relatively inert gaseous atmosphere to minimize contamination by atmospheric air. The inert gaseous atmosphere may be helium, as an example, of the type commercially available, that is, comprising approximately 95% helium by weight. Other suitable inert gaseous atmospheres which can be employed include argon. The crushing and grinding steps are performed in containers which are substantially nonreactive with the thermoelectric material. Thus, the thermoelectric material may be coarsely crushed in a platner mortar and finely ground in an agate mortar. The powder thus formed is sieved through a fine mesh screen which is nonreactive with the thermoelectric material. The finest mesh screen commonly available (325 mesh) can be used, although more coarse meshes are also useful.

The crushing, grinding and sieving steps above described are employed primarily for convenience of handling the thermoelectric material in the next step which consists of weighing out the thermoelectric material to obtain a desired amount thereof. Thus, in the event that the desired amount of thermoelectric material comprises many individual pieces of relatively large size, it is evident that the crushing, grinding and sieving steps may be omitted and the thermoelectric material weighed directly. Again, to avoid contamination by atmospheric air, it is preferable, although not necessary, to perform the weighing step in a relatively inert gaseous atmosphere. The crushing, grinding and sieving steps, if employed, and the weighing step may all be conveniently performed within a first enclosed chamber containing the inert gaseous atmosphere, if desired.

The desired amount of weighed out thermoelectric material is thence deposited within a relatively noncontaminated containing device which is adapted to be pressed by external pressure. The containing device may be, for example, a die of a punch and die set, the die material being determined primarily by the pressing pressure to be employed and the thermoelectric material being processed. Thus, the die and punch material should possess the characteristics of being nonreactive with the thermoelectric material at both ambient temperature and the high temperatures employed in the hot pressing step and must be sufficiently strong to withstand the pressure exerted on the punch and die during the hot pressing step. Examples of punch and die materials which may be employed are ceramics such as alumina, and graphites such as type AUC manufactured by Union Carbide Corporation. It is preferred to utilize punches and dies constructed of the highest purity materials to further avoid contaminating the thermoelectric material processed therein. The interior surface of the die is selected to have the desired form of the pressed thermoelectric element. To minimize contamination of the punch and die by atmospheric air and other contaminating agents, the punch and die may be baked in a vacuum and subsequently cooled in a relatively inert gaseous atmosphere such as argon, helium or nitrogen prior to the die being filled with the thermoelectric material. If the additional vacuum baking and inert gas cooling steps are employed, the punch and die should be protected from exposure to atmospheric air in the succeeding steps.

The thermoelectric material filled die and punch are next inserted within a pressing chamber which may comprise another part of the enclosed chamber within which the thermoelectric material was weighed and deposited into the die, or alternatively, the thermoelectric material filled die and punch may be transferred to a second enclosed chamber containing a pressing chamber therein, the second chamber being disposed apart from the first chamber. The pressing chamber is adapted to exert a predetermined pressure upon the thermoelectric material by exerting such pressure on the containing device, and in the particular case of a punch and die set, the pressure is exerted on the punch. The pressing means may comprise a conventional hydraulic ram. Prior to applying the pressure upon the punch, a region within the pressing chamber including the punch and die is evacuated to a substantial vacuum environment to degas the thermoelectric material, punch and die and thereby minimize any gaseous contamination thereof. The evacuation may be accomplished by a conventional diffusion pump or other vacuum producing devices to obtain a vacuum preferably of at least $10^{-6}$ torr to minimize the evacuation time interval. The vacuum of $10^{-6}$ torr is not a limitation, however, and may vary by several orders of magnitude. The evacuating step is generally performed over a time interval of several hours, four to six hours being an average interval, depending on the size of the pumping equipment and volume to be pumped. Mechanical agitation such as vibration of the die and/or thermal agitation such as heating of the thermoelectric material to a temperature in the range between 100° C. and 400° C. may further aid in the degassing process. Alternatively, it may be found to be more convenient to perform the degassing process in another enclosed chamber, and subsequently transfer the degassed punch and thermoelectric material filled die to the pressing chamber.

After the thermoelectric material filled die and punch have been sufficiently degassed and are positioned with the pressing chamber, the interior of the pressing chamber, or at least a region within the pressing chamber including the punch and die is evacuated to a substantial vacuum, again preferably in the order of at least $10^{-6}$ torr. The thermoelectric material is thence heated to a first temperature substantially below the melting point of the thermoelectric material while maintaining the substantial vacuum environment again preferably of at least $10^{-6}$ torr. A high intensity heat source, such as an electric induction heating coil is suitably arranged (inside or outside the pressing chamber) to heat the thermoelectric material to a desired temperature within the pressing chamber. As an example, in the case of lead telluride, the induction heating coil is sufficiently electrically energized to heat the lead telluride to a first temperature in a range between 400° C. and 500° C. After the thermoelectric material has been heated to the first temperature, the material is pressed by actuating the pressing chamber and thereby exerting a predetermined pressure upon the punch of the punch and die set while simultaneously heating the thermoelectric material to a second temperature intermediate the first temperature and melting point of the thermoelectric material. In the case of lead telluride, the material is heated to a temperature in the range between 500° C. and 850° C. (melting point being 917° C.), the pressure and elevated temperature being maintained for a predetermined time interval. The substantial vacuum environment is maintained during this hot pressing step. The values of the variables of pressure, temperature and time are selected and interrelated such that a greater magnitude of one or two of the variables in general permits a smaller magnitude of the remaining two or one variables, respectively, and still produce high density thermoelectric elements having a form defined by the interior surface of the die. The pressure employed is generally in a range having a lower limit of approximately 1000 lbs. per square inch and an upper limit defined by the strength of the die material. Thus, in the case of a graphite die an upper limit of approximately 5000 pounds per square inch (p.s.i.) is established and in the case of ceramic, approximately 69,000 p.s.i. A pressure below 1000 lbs. per square inch may be employed under circumstances wherein a higher temperature and/or longer hot pressing time interval are employed. Examples of values of the three variables, in the case of lead telluride are (1) 3000 p.s.i., 550° C., 4 hours, (2) 25,000 p.s.i., 600° C. ¼ hour, (3) 6000 p.s.i., 700° C., ½ hour and (4) 5000 p.s.i., 800° C., ¼ hour.

At the termination of the hot pressing operation, the thermoelectric material may be immediately removed from the die if protected from atmospheric air, but more preferably is cooled to a third temperature substantially below the first temperature, a convenient third temperature being approximately 100° C. or in a range between 50° C. and 150° C. and the pressed thermoelectric element is thence removed from the die. In the case of a graphite die, the cooling may be obtained by merely deenergizing the electric induction heater and cooling by radiation. In the case of a ceramic die, the electric power to the induction heater is gradually reduced to obtain the cooling effect. During the cooling process, the pressure exerted upon the punch, and thus the thermoelectric material, may be maintained and removed upon the thermoelectric material attaining the third or cooled temperature, or alternatively, the pressure may be entirely removed at the end of the hot pressing operation. Finally, the pressure may be gradually reduced during the cooling if desired.

A further refinement in our method for producing thermoelectric elements includes the following steps. The punch and thermoelectric material filled die are inserted within another enclosed chamber which may conveniently be a quartz tube or other enclosure constructed of suitable material having adequate temperature resistance and being nonreactive with the thermoelectric material. The quartz tube is then evacuated to a vacuum again preferably of at least $10^{-6}$ torr to degas the thermoelectric material, punch and die, and quartz tube interior surface, and the quartz tube is thence inserted into the pressing chamber. The use of the additional enclosed chamber (quartz tube) permits the use of a smaller pumping device to obtain the vacuum in the vicinity of the punch and die since a smaller volume is now being evacuated, namely, merely that of the interior of the quartz chamber. The use of this additional enclosed chamber further provides a convenient means for transferring the thermoelectric material filled die and punch under vacuum conditions to a pressing chamber which may be at a location remote from the chamber obtaining the vacuum.

Thus, it may be appreciated that the entire processing of the thermoelectric elements may be performed within a single enclosed chamber, preferably divided into compartments wherein an inert gaseous atmosphere is maintained within one compartment, a vacuum may be created and maintained in a second compartment and the hot pressing may be performed in a third compartment. In the alternative, entirely separate enclosed chambers may be employed for each of the separate steps of the method or a number of the steps may be performed within a single chamber and the thermoelectric material thence transferred to a second and possibly third chamber, as desired. Although the hot pressing step has been described as being performed within a substantial vacuum, it is to be understood that such hot pressing may also be performed within an inert gaseous atmosphere at pressures as high as approximately 10 torr. The hot pressing under vacuum conditions has been selected since such procedure does not necessitate a further change in gaseous environments, the punch and thermoelectric material filled die previously having been degassed in a substantial vacuum.

Thermoelectric elements are formed from thermoelectric materials other than lead telluride by employing a hot pressing process similar to that hereinabove described. The major distinction in the process when utilizing other thermoelectric materials is the temperature at which the hot pressing is accomplished. Thus, bismuth telluride is hot pressed at a temperature within a range of 300° C. to 500° C., and an alloy of magnesium, germanium and tin within a range of 550° C. to 750° C.

As a generalization, it may be stated that the hot pressing temperature for any thermoelectric material is in a range below the melting point thereof, and above the temperature at which plastic deformation thereof occurs for the load or pressure applied.

The product obtained by our process as hereinabove described, that is the hot pressed thermoelectric element, is of high density. By high density is meant a density of at least 99.5% of theoretical 100% density wherein 100% density is defined, in the case of lead telluride as 8.249 grams per cubic centimeter. The high density obtained by our process, as compared to a density of approximately 85% obtained in the cold pressing method, obviously produces thermoelectric elements of far superior characteristics. In particular, the thermoelectric elements produced by our process are fabricated in the form of true fine grained polycrystals, essentially free from voids, cracks or other defects. The improved crystalline state of the thermoelectric material after hot pressing thereof results in greatly improved physical properties of the pressed thermoelectric element. In particular, the thermoelectric elements fabricated by our hot pressing process can be deformed approximately 50% in compression before fracturing as compared to approximately 15% for cold pressed lead telluride. Further, the thermoelectric elements produced by our process have an ultimate compressive strength of approximately 25,000 lbs. per square inch versus 14,000 lbs. per square inch for cold pressed lead telluride.

Having described a new method for fabricating thermoelectric elements in accordance with our invention, it is believed obvious that other modifications and variations of our invention are possible in light of the above teachings. It is, therefore, to be understood that changes may be made in the particular embodiment of the invention described which are in the full intended scope of the invention as defined by the following claims.

What we claim as new and desire to secure by Letters Patent of the United States is:

1. A method for manufacturing fine grain polycrystalline semiconductive lead telluride thermoelectric elements having an ultimate compressive strength of about 25,000 pounds per square inch and a density approximately 99.5 percent of theoretical density comprising the steps of placing a desired amount of said lead telluride powder in the die receptacle of a punch and die forming set composed of a material which is nonreactive with said powder at any temperature up to the melting point of said powder and from which punch and die set contaminating reactive atmospheric gases have previously been removed while substantially excluding reactive atmospheric gases from said punch and die set and said powder, assembling said punch and die forming set containing said powder while substantially excluding reactive atmospheric gases from said punch and die and said powder, degassing said assembly and contained powder by maintaining said assembly and contained powder within a vacuum environment for a period of time sufficient to substantially remove any occluded gases, heating said assembly to a temperature of from about 400° to about 500° C. while substantially excluding reactive atmospheric gases from said assembly and contents, applying a pressure of at least about 1000 p.s.i. on said punch of said assembly to compress the powder contained within said die receptacle while simultaneously increasing the temperature of said powder to a temperature in the range between about 500° C. to about 850° C. while maintaining said assembly and contents at subatmospheric pressure and substantially excluding reactive atmospheric gases therefrom, maintaining said pressure and temperature to said powder for a time sufficient to achieve a compact density of about 99.5 percent of the theoretical density, cooling said compact to a temperature of about 50° C. to 150° C. and removing the compacted thermoelectric element from said punch and die set.

2. The method recited in claim 1 wherein said lead telluride powder is initially substantially free from contamination by reactive atmospheric gases.

3. The method recited in claim 1 wherein during said degassing step said assembly and contained powder is agitated to promote the removal of occluded gases.

References Cited by the Examiner

UNITED STATES PATENTS

| | | | |
|---|---|---|---|
| 3,132,488 | 5/1964 | Epstein et al. | 75—226 X |
| 3,201,235 | 8/1965 | Mueller et al. | 75—201 |

L. DEWAYNE RUTLEDGE, *Primary Examiner.*

LEON D. ROSDOL, *Examiner.*

R. L. GRUDZIECKI, *Assistant Examiner.*